(12) United States Patent
Patel et al.

(10) Patent No.: US 6,317,325 B1
(45) Date of Patent: Nov. 13, 2001

(54) APPARATUS FOR PROTECTING CIRCUIT PACK ASSEMBLIES FROM THERMAL AND ELECTROMAGNETIC EFFECTS

(75) Inventors: Naresh C. Patel, Howell; Gregory Simeon Sysak, Freehold, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/510,808

(22) Filed: Feb. 23, 2000

(51) Int. Cl.$^7$ .................................................... H05H 7/20
(52) U.S. Cl. .................... 361/704; 165/80.3; 165/185; 174/16.3; 257/719; 361/710; 361/715
(58) Field of Search ................... 165/80.2, 80.3, 165/185; 174/16.3; 257/718–719, 726–727; 361/690, 704, 707, 709–710, 715

(56) References Cited

U.S. PATENT DOCUMENTS

| 5,757,621 |   | 5/1998 | Patel ..................................... 361/719 |
| 5,812,375 | * | 9/1998 | Caperson ............................. 361/707 |
| 5,903,435 | * | 5/1999 | Hsieh et al. ......................... 361/704 |
| 6,025,991 | * | 2/2000 | Saito ..................................... 361/704 |

* cited by examiner

Primary Examiner—Gregory Thompson
(74) Attorney, Agent, or Firm—Gregory J. Murgia (57) ABSTRACT

An apparatus for dissipating heat generated by components housed within modules on a circuit pack includes a first cover member having a deflectable cantilevered region that is defined by a U-shaped slot. A conductive post is mounted or otherwise formed on the underside of the cantilevered region so that the post extends downwardly into the module when the first cover member is secured to the module housing. The conductive post cooperates with a top surface of a component in the module so that heat generated from the component is transferred from the component through the conductive post and distributed along the first cover member. To further reduce interference caused by electromagnetic radiation passing through the U-shaped slot, a second cover member, which includes an opening that is sized for receiving and passing through the conductive post, is disposed between the module housing and the first cover member. The second cover member covers the U-shaped slot in the first cover member to substantially reduce electromagnetic interference caused by one or more components in the module.

20 Claims, 4 Drawing Sheets

APPARATUS FOR PROTECTING CIRCUIT PACK ASSEMBLIES FROM THERMAL AND ELECTROMAGNETIC EFFECTS

TECHNICAL FIELD

This invention relates generally to circuit pack assemblies used in communication systems and, more specifically, to physical design features that improve the thermal and electromagnetic performance of such circuit pack assemblies.

BACKGROUND OF THE INVENTION

The physical design features of a circuit pack assembly have become important considerations as communications systems evolve to provide more capability using equipment that occupies less space. A common design approach for circuit pack assemblies is to package circuit functions into sub-assemblies or modules, especially in circuit pack assemblies including electronic and optical circuitry. In an effort to provide more functionality in a circuit pack assembly, the size of the modules is being reduced. With the closely packed components within a module, thermal effects as well as electromagnetic radiation therefore become significant concerns. For example, heat generated by components within the modules can become a problem because certain components have maximum operating temperatures. When these temperatures are exceeded, component and ultimately system performance suffers.

Unfortunately, solutions to each of these problems can often be at cross-purposes. For example, one approach for shielding other modules from electromagnetic radiation generated by components is to enclose each module with electrically conductive material to restrict electromagnetic radiation, e.g., to substantially seal the module. However, this solution actually leads to an increased build-up of heat within the module.

Various heat dissipation techniques are also known. One such approach is described in U.S. Pat. No. 5,757,621 wherein a heat sink is attached to a printed circuit board using standoff and spring combinations so that the heat sink makes the appropriate level of thermal contact with the electronic devices on the printed circuit board. Heat sinks having a plurality of vertically and upwardly extending fins which attach to circuit components are also known. Both of these types of heat dissipation arrangements require space on the circuit board assembly for mounting the heat sink as well as additional height clearance above the components. As such, these heat dissipation arrangements are not particularly well-suited in circuit pack assemblies which have substantial space limitations.

SUMMARY OF THE INVENTION

Heat generated by a component in a circuit pack module is dissipated according to the principles of the invention by using a thermally conductive structure as a cover for the module housing for transferring heat from the component and distributing the heat across the entire surface area of the conductive structure. The thermally conductive structure incorporates a cantilevered design and includes a conductive post that maintains contact with and applies a substantially constant amount of force to a top surface of a component in the module. By incorporating a cantilevered design in the module cover, heat dissipation can be achieved using a structure that occupies substantially less space than prior arrangements and which does not damage the component by applying an excessive amount of force.

According to one illustrative embodiment, an apparatus for dissipating heat generated by components housed within modules on a circuit pack includes a first cover member having a deflectable cantilevered region that is defined by a U-shaped slot. A conductive post is mounted or otherwise formed on the underside of the cantilevered region so that the post extends downwardly into the module when the first cover member is secured to the module housing. The conductive post cooperates with a top surface of a component in the module so that heat generated from the component is transferred from the component through the conductive post and distributed along the first cover member. According to another aspect of the invention, interference caused by electromagnetic radiation passing through the U-shaped slot is substantially reduced by disposing a second cover member between the module housing and the first cover member. The second cover member includes an opening that is sized for receiving and passing through the conductive post. The second cover member covers the U-shaped slot in the first cover member to substantially reduce electromagnetic interference caused by one or more components in the module. Accordingly, a solution is provided according to the inventive principles that addresses both thermal and electromagnetic impairments in circuit packs.

BRIEF DESCRIPTION OF THE DRAWING

A more complete understanding of the invention may be obtained from consideration of the following detailed description of the invention in conjunction with the drawing, with like elements referenced with like reference numerals, in which.

DETAILED DESCRIPTION OF THE INVENTION

Although the principles of the invention are particularly well-suited for use in circuit packs used in lightwave communication systems, and shall be described in this exemplary context, those skilled in the art will understand that the teachings of the invention are also applicable in any type of system that utilizes circuit packs, circuit assemblies, circuit boards, and so on. In particular, embodiments of the invention are shown and described herein for use with an optical translator unit (OTU) circuit pack having one or more transmitter and receiver modules integrated within the circuit pack. However, these embodiments are only meant to be illustrative and not limiting.

Figure 1:
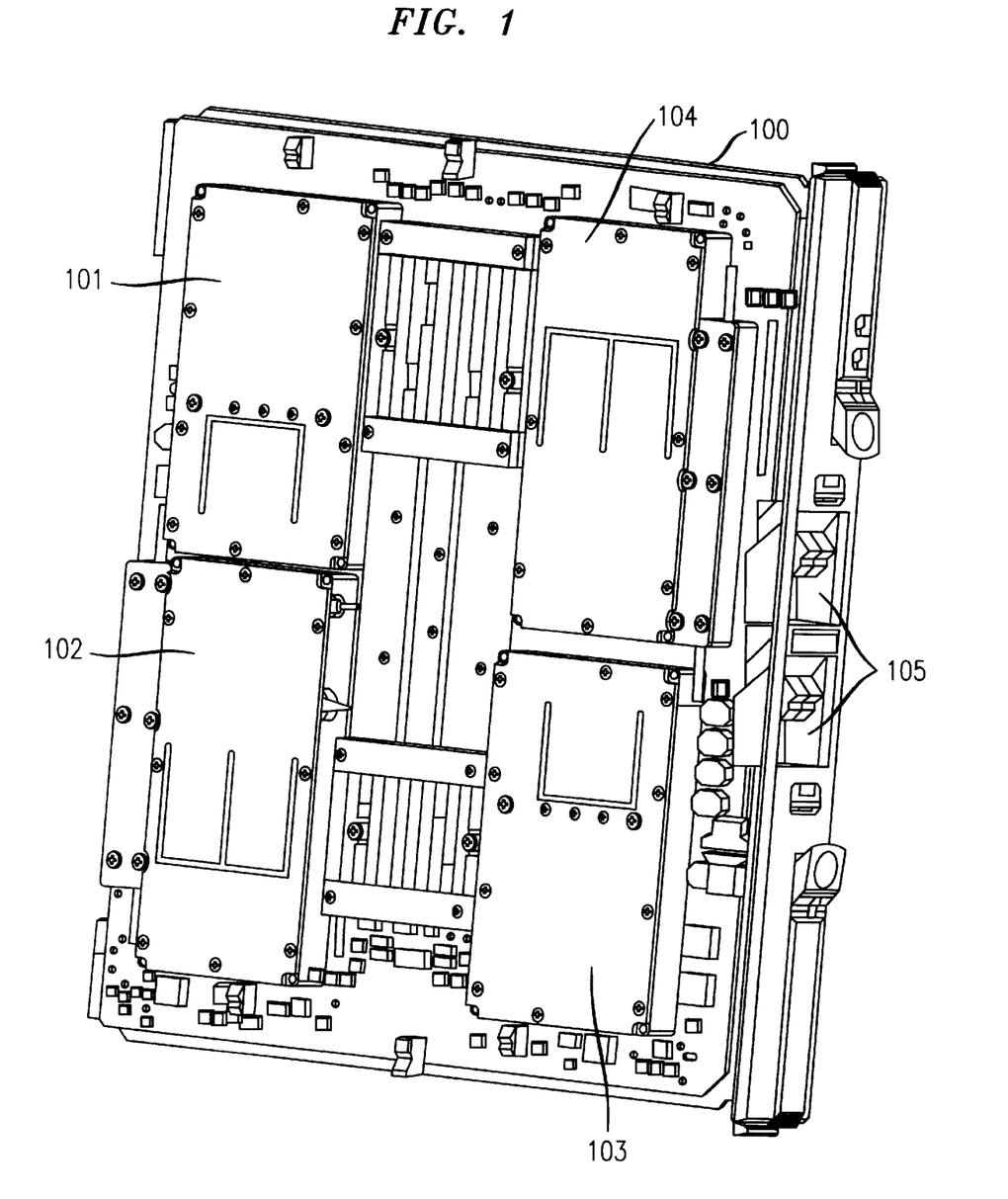
FIG. 1 is a perspective view of a circuit pack assembly having a multi-module design in which the principles of the invention may be employed.

FIG. 1 shows a typical circuit pack 100 in which the principles of the invention may be employed. In one illustrative embodiment, circuit pack 100 may be an OTU circuit pack used for a number of purposes in an optical line transmission system. For example, OTU's may be used for wavelength conversion between user equipment (e.g., well-known SONET/SDH terminal equipment) and the optical line transmission system, for regeneration of an optical signal to clean up signal impairments, and so on. As shown in FIG. 1, circuit pack 100 includes a plurality of separate modules 101–104 mounted to circuit pack 100. Continuing with the OTU circuit pack as an example, modules 101–104 would correspond to transmitter and receiver modules that receive and supply optical signals in a well-known manner via input and output ports 105. Although not shown, modules 101–104 each include circuit components for carrying out a respective function. The modular design of circuit pack 100 provides several advantages both in operation and maintenance scenarios. For example, circuit pack 100 can be repaired, upgraded, modified and so on by separately removing and replacing modules 101–104 instead of changing out the entire circuit pack 100. Other benefits of this type of modular design will be apparent to those skilled in the art.

As previously described, a general trend is for circuit packs to have more functionality while occupying less physical space. As such, the number of modules on the circuit pack, such as modules 101–104 in circuit pack 100, as well as the number of components in each of the modules continues to increase. This increase in component density gives rise to several problems including thermal impairments and electromagnetic radiation. For example, heat generated by components within modules 101–104 can become a problem because certain components have maximum operating temperatures. When these temperatures are exceeded, component and ultimately system performance suffers. Furthermore, many circuit packs in optical line systems, such as circuit pack 100, are externally convection-cooled with air. As such, dissipating heat in modules 101–104 and circuit pack 100 becomes a considerable challenge. Components operating within a module may also generate electromagnetic radiation, the effects of which are well-known.

Figure 2:
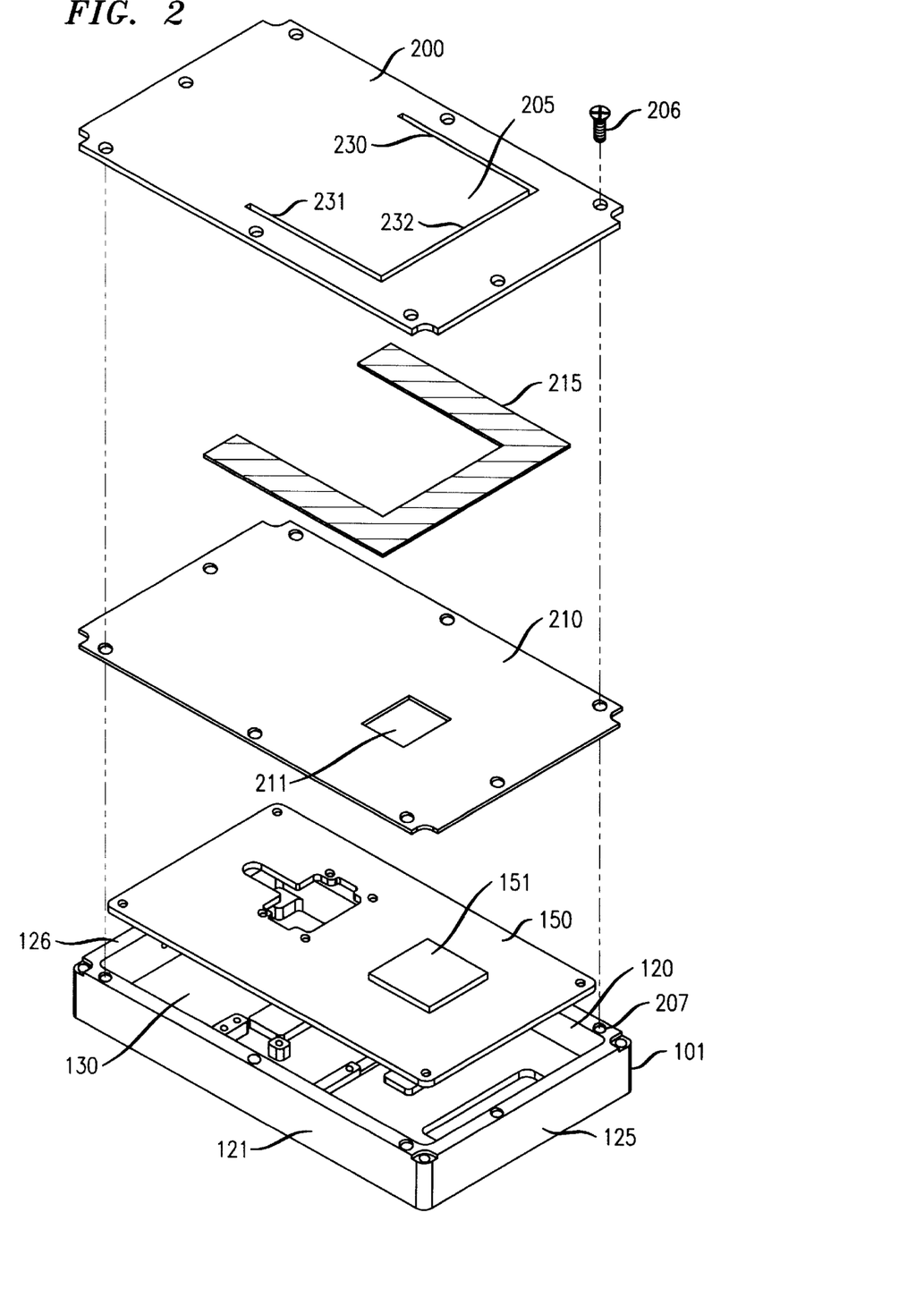
FIG. 2 is a perspective view of a disassembled module assembly incorporating one embodiment of the invention.

According to the principles of the invention, the physical design features of modules 101–104 can be modified to reduce the aforementioned adverse effects of heat and electromagnetic radiation. More specifically, FIG. 2 shows one exemplary embodiment of the invention for use with module 101 from circuit pack 100 (FIG. 1), shown here in a disassembled state. Module 101 is a rectangular enclosure including two pairs of opposing side surfaces 120–121 and 125–126 extending upwardly from a rectangular bottom surface 130 to define a recessed portion for receiving and housing circuit components, such as printed circuit board 150. However, it should be noted that this embodiment is only meant to be illustrative and not limiting since module 101 may be of any suitable shape. For simplicity of explanation and illustration of the principles of the invention, printed circuit board 150 is shown to include a single component 151 which is assumed, for the purposes of describing the invention, to generate heat and electromagnetic radiation. In practice, of course, printed circuit board 150 may include a plurality of components. Printed circuit board 150 can be seated, mounted, or otherwise fastened within module 101 in a number of different ways, none of which are the subject of the invention. Rather, the invention is directed to the features of the cover used for enclosing module 101.

According to one illustrative embodiment of the invention, an apparatus for dissipating heat from component 151 includes first cover member 200, conductive material 215, and second cover member 210 which are disposed over the opening (e.g., recessed portion) of module 101 to enclose the contents of module 101 therein. As shown, first cover member 200 and, optionally, second cover member 210 attach to the top portion of module 101 to cover the opening and enclose the contents of module 101 therein. Cover members 200 and 210 may be attached, mounted, or fastened to module 101 in a number of different ways, such as by using screws 206 that fit into the counter-sunk screw holes 207 in the opposing side surfaces 120–121 of module 101. Other methods and means for fastening will be apparent to those skilled in the art.

As shown in FIG. 2, cover member 200 includes a cantilevered region or tab 205 formed by a U-shaped slot having a pair of parallel longitudinal slots 230 and 231 and a transversal slot 232 extending between longitudinal slots 230 and 231. Because of the U-shaped slot design, cantilevered region 205 is deflectable such that the end of cantilevered region 205 closest to transversal slot 232 exhibits the most deflection during operation as will be described below in further detail. Some of the significant factors affecting the amount of deflection provided by cantilevered region 205 is the length of longitudinal slots 230 and 231, the material selected for cover member 200, and so on.

Figure 3:
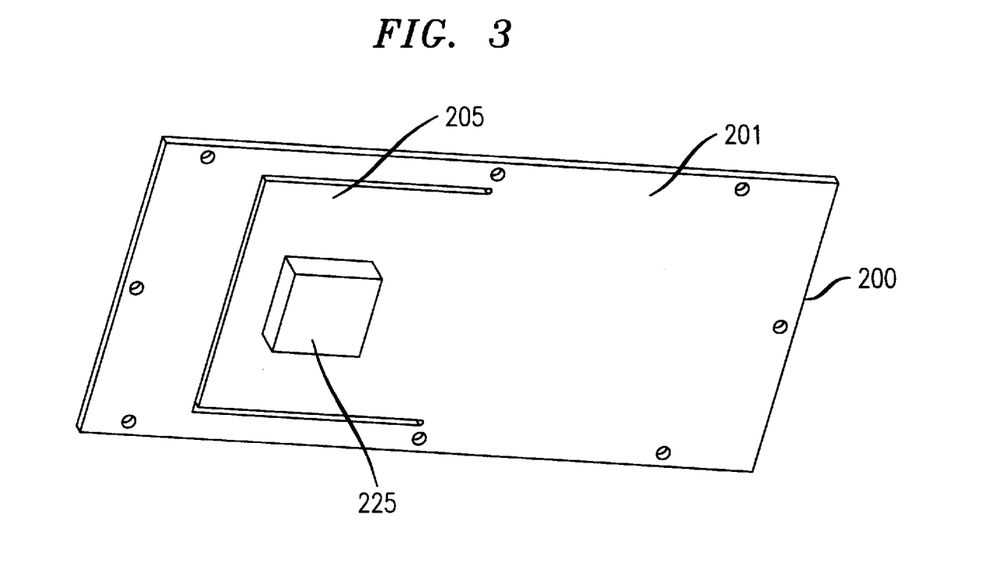
FIG. 3 shows a bottom perspective view of one illustrative embodiment of the cantilevered cover member and post assembly according to principles of the invention.

FIG. 3 shows bottom surface 201 of cover member 200. As shown, cantilevered region 205 includes a downwardly protruding conductive post 225, the function of which will be described in further detail below. Briefly, when cover member 200 is secured to module 101, conductive post 225 engages the top surface of component 151 (see FIG. 2). Because conductive post 225 is part of cantilevered region 205, an appropriate amount of compressive force can therefore be applied from conductive post 225 to component 151 without causing damage to component 151. In particular, as conductive post 225 comes in contact with and cooperates with the top surface of component 151, cantilevered region 205 deflects upward providing sufficient force to achieve maximum thermal conductivity while minimizing excess force which might otherwise lead to component damage.

Figure 4:
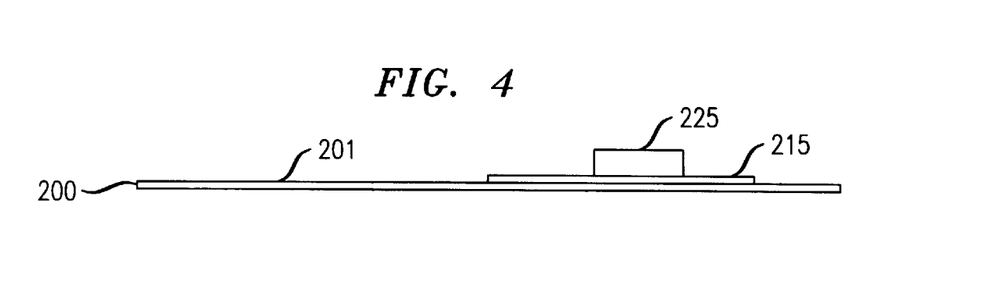
FIG. 4 is a side elevation view of one illustrative embodiment of the cantilevered cover member and post assembly according to principles of the invention.

FIG. 4 shows a side view of cover member 200 showing conductive post 225 and conductive material 215. The dimensions of conductive post 225 are a matter of design choice and will depend on the surface area and height of component 151 (FIG. 2) as well as other factors. In one embodiment, the material selected for cover member 200 and conductive post 225 is tin-plated copper because of its conductive and anti-corrosive properties. More specifically, copper is selected because of its conductive properties and tin plating is optionally added to protect against corrosion. Other suitable metals and alloys for cover member 200 will be apparent to those skilled in the art. For example, other less conductive metals, such as aluminum, may also be suitable and appropriate selection will depend on other design considerations.

The dimensions and thickness of first cover member 200 are also a matter of design choice and will depend on factors such as module size, weight restrictions, and so on. In general, the methods of fabricating cover member 200 will be apparent to those skilled in the art. For example, cover member 200 may be "punched" from copper sheeting, cantilevered region 205 may be formed by "punching" slots 230–232, holes may be "punched" in the periphery of cover member 200 for mounting to module 101, and conductive post 225 may be a separate piece soldered to cover member 200. Alternative molding techniques may also be employed to fabricate the aforementioned features of cover member 200. The completed cover member 200 may then be optionally plated with tin to prevent corrosion of the cover member 200 metal, e.g., copper. It should be noted that the embodiments shown and described herein and the methods for fabricating same are meant to be illustrative only and not limiting in any way.

In operation, cover member 200 (FIG. 2) is attached to the top of module 101, such as by using screws 206 to engage counter-sunk screw holes 207, thereby enclosing module 101. Cover member 200 is designed so that conductive post 225 is in matched arrangement with component 151 in module 101 so that conductive post 225 cooperates with and provides a substantially constant amount of force to the top surface of component 151. Because conductive post 225 is attached or otherwise formed as part of cantilevered region 205, contact with component 151 is achieved while at the same time assuring that an unnecessary amount of force is not applied which may damage component 151. In particular, as conductive post 225 comes in contact with component 151, cantilever region 205 is deflectable in an upward direction so that cover member 200 can be secured to module 101 without conductive post 225 imposing too much force on the top surface of component 151. Although an appropriate selection of the length of conductive post 225 is important, the cantilevered design allows for a certain amount of design freedom not afforded by prior arrangements.

Moreover, the cantilevered design approach is especially advantageous when physical space is limited. For example, circuit packs can be very narrow, e.g., 40 mm width in some exemplary configurations, and are generally tightly packed side by side in a shelf or rack assembly leaving little clearance between packs. Consequently, the module height (e.g., thickness of module 101 as measured from bottom surface 130 of module 101 to the top surface of cover member 200 when circuit pack 100 is viewed in a vertical orientation) is similarly restricted. For example, some circuit pack designs may dictate a combined maximum allowable thickness on the order of approximately 63 mils for cover members 200, 210, conductive tape 215, and the associated mounting hardware when mounted to module 101. Advantageously, the inventive embodiments shown and described herein can achieve such tolerances. By contrast, the space required for prior art heat sink arrangements which use additional hardware (e.g., stand-offs, springs, etc.) or elevated heat fins will typically exceed design tolerances in these limited clearance applications.

Once cover member 200 is secured to module 101 and conductive post 225 is in contact with component 151, heat generated by component 151 is transferred (i.e., conducted) via conductive post 225 to the surfaces of cover member 200. As described, module 101 and circuit pack 100 are typically convection cooled by air. Consequently, heat is effectively dissipated from component 151 in module 101 by distributing the heat across the entire surface area of cover member 200 and externally convection-cooling module 101. To enhance thermal conductivity, conductive thermal compound may also be applied to the top surface of component 151 prior to attaching cover member 200.

The effectiveness of heat distribution along cover member 200 is a function of the length of transversal slot 232 among other factors. For example, heat dissipation according to the principles of the invention is effected by providing a conductive path from component 151 in module 101 via conductive post 225 to cover member 200 to transfer the heat from component 151 to cover member 200. In effect, heat from component 151 is dissipated by distributing the heat across cover member 200. Because the surface area of cantilevered region 205 will be larger when the length of transversal slot 232 is increased, the distribution of heat across cover member 200 will therefore be effectively increased.

As described, the length of longitudinal slots 230 and 231 is selected to provide an appropriate amount of deflection in cantilevered region 205 so that a substantially constant amount of force can be applied to the top surface of component 151 without causing damage. In particular, cantilevered region 205 exhibits greater deflectability when longitudinal slots 230 and 231 are longer, while the converse is also true.

According to another aspect of the invention, electromagnetic interference (EMI) caused by electromagnetic radiation generated by component 151 or other components (not shown) within module 101 is substantially reduced. Returning to FIG. 2, second cover member 210 is disposed between first cover member 200 and module 101 in the assembled state. Second cover member 210 is shown to include an opening or aperture 211. Accordingly, aperture or opening 211 in second cover member 210 has a predetermined size that allows conductive post 225 to pass through but minimizes the amount of space, i.e., gap, around conductive post 225. When disposed between first cover member 200 and module 101, second cover member 210 effectively covers the gap created by the U-shaped slot in cantilevered region 205 of first cover member 200. As such, second cover member 210 provides an added layer of shielding that prevents electromagnetic radiation from passing through longitudinal slots 230, 231 and transversal slot 232.

In one embodiment, the material selected for second cover member 210 is aluminum. However, those skilled in the art will understand that many other suitable materials may be used accordingly. For example, tin-plated copper may be used for both first and second cover members 200 and 210. In general, appropriate selection of materials will depend on several design considerations including, but not limited to: thermal conductivity; electromagnetic properties; fabrication constraints and requirements; overall weight requirements of module 101 and circuit pack 100; and so on.

Figure 5:
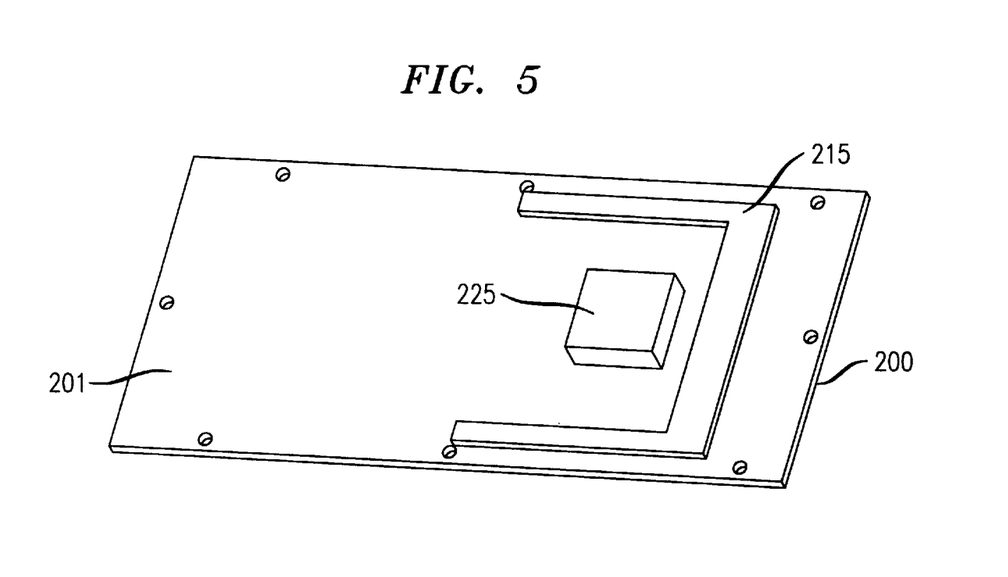
FIG. 5 is a bottom view of another illustrative embodiment of the cantilevered cover member according to principles of the invention.

FIG. 5 illustrates another feature for enhancing protection against electromagnetic interference according to the principles of the invention. As shown, conductive material 215 is attached, adhered, bonded, or otherwise affixed to bottom surface 201 of first cover member 200 in order to cover the U-shaped slot (not shown) of cantilevered region 205. In this embodiment, conductive material 215 is U-shaped to sufficiently cover longitudinal slots 230, 231 and transversal slot 232 of cantilevered region 205 (FIG. 2). Conductive material 215 may be one piece or multi-piece and should be selected based on similar considerations as first cover member 200, e.g., conductivity and so on. In one embodiment, conductive material 215 is flexible conductive tape which maintains a bond with first cover member 200 even as cantilevered region 205 is deflected during assembly of module 101. By way of example, commercially available Schlagel CFT Conductive Tape, Part Number 5923-0050-0 may be used for conductive material 215. This type of CFT tape has a shielding effectiveness that is an average 60 dB in the range of 30 MHz to 1 GHz, has a volume resistance that is less than $1.0\Omega$/cm at 0.6 kg/cm$^2$ force, and offers resistance to cracking, corrosion and shrinkage.

By disposing conductive material 215 on the bottom surface of first cover member 200, second cover member 210 and conductive material 215 cooperate to prevent the passage of electromagnetic radiation through longitudinal slots 230, 231 and transversal slot 232 of cantilevered region 205. More specifically, conductive material 215 is effectively sandwiched between first cover member 200 and second cover member 210 thereby providing an enhanced seal to prevent passage of electromagnetic radiation.

Figure 6:
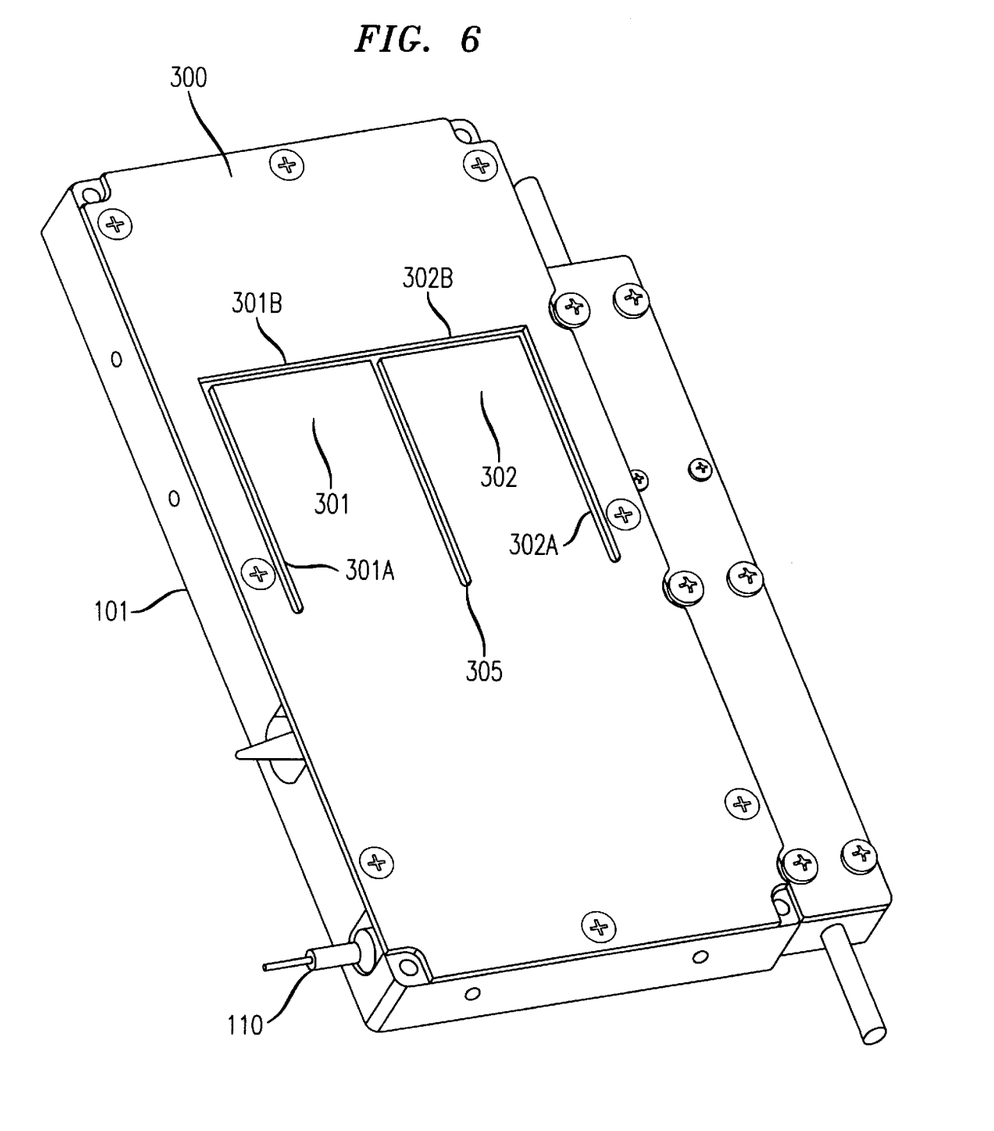
FIG. 6 is a bottom view of another illustrative embodiment of the cantilevered cover member according to principles of the invention.

FIG. 6 shows yet another alternative embodiment of the invention for use with module 101 from circuit pack 100 in FIG. 1. Module 101 is again defined by a rectangular enclosure or housing that contains various circuit components (not shown). Module 101 may also include one or more input and output ports, such as port 110. In this embodiment, cantilever cover member 300 includes two cantilevered tabs 301 and 302, each including a conductive post member (not shown) attached or otherwise formed on its respective underside. As with the previously described embodiment, cantilevered tabs 301 and 302 can be formed by cutting away material from cover member 300 thereby forming open "tracks" or slots 301A, 301B, 302A, 302B, and 305. Additionally, cantilevered tabs 301 and 302 may share a common center slot 305 as shown. Alternatively, cantilevered tabs 301 and 302 may each include its own respective slot. Other methods for forming cantilevered tabs 301 and 302 in cover member 300 will be apparent to those skilled in the art and are contemplated by the teachings herein.

It should be noted that other modifications to the embodiments shown and described herein will be apparent to those skilled in the art according to the principles of the invention. For example, a cantilevered cover member may include any number of cantilevered tabs (regions) depending on the composition of the module (e.g., number and location of components within the module) as well as other design considerations. While FIG. 6 illustrates one such alternative embodiment employing two side-by-side cantilevered tab members, a plurality of cantilevered tab members may also be formed at various locations on the cover member to engage components at different locations within the module. Moreover, a cantilevered tab member may include more than one conductive post to dissipate heat from multiple components. Conductive posts extending from the cantilevered tab members may also have different shapes depending on the component to be matched and other design factors. Consequently, there may be many different variations to the illustrative embodiments shown and described herein that are consistent with the spirit and scope of the invention.

Furthermore, although the illustrative embodiments described herein are particularly well-suited for use in an OTU circuit pack for an optical line system, those skilled in the art will understand from the teachings herein that the principles of the invention may also be employed in conjunction with other types of circuit packs, modules, and assemblies used in other system and network applications. For example, the principles of the invention may be employed in any application in which a module requires electromagnetic shielding and internal component contact for heat sinking to a module case or housing, especially those having restrictions on dimensions, e.g., clearance between various modules, etc. Accordingly, the embodiments shown and described herein are only meant to be illustrative and not limiting in any way.

What is claimed is:

1. An apparatus for dissipating heat from one or more components disposed in a circuit module, the module including a housing having an opening therein for receiving the one or more components, the apparatus comprising:

a first cover member disposed over the opening of the housing, the first cover member including a cantilevered region and a conductive post protruding downwardly from the cantilevered region into the module, the conductive post being in cooperation with a top surface of a component in the module so that heat generated from the component is transferred from the component through the conductive post and distributed along the first cover member, the cantilevered region being deflectable by engagement of the conductive post with the top surface of the component so that the conductive post is capable of maintaining contact with and providing a substantially constant amount of force to the top surface of the component without damaging the component.

2. The apparatus according to claim 1, wherein the module is cooled externally via air convection.

3. The apparatus according to claim 1, wherein the first cover member comprises a material selected from the group consisting of copper, tin-plated copper, and aluminum.

4. The apparatus according to claim 1, wherein the conductive post is in matched arrangement with the component so that the conductive post maintains contact with and provides a substantially constant amount of force to the top surface of the component.

5. The apparatus according to claim 4, wherein the cantilevered region is deflectable so that the conductive post is capable of maintaining contact with and providing a substantially constant amount of force to a top surface of components having different height tolerances.

6. An apparatus for dissipating heat from one or more components disposed in a circuit module, the module including a housing having an opening therein for receiving the one or more components, the apparatus comprising:

a first cover member disposed over the opening of the housing, the first cover member including a cantilevered region defined by a U-shaped slot in the first cover member, the U-shaped slot having a deflectable end portion, the first cover member further including a conductive post disposed on the deflectable end portion and protruding downwardly from the cantilevered region into the module, the conductive post being in cooperation with a top surface of a component in the module so that heat generated from the component is transferred from the component through the conductive post and distributed along the first cover member.

7. The apparatus according to claim 6, wherein the U-shaped slot is defined by a pair of parallel longitudinal slots and a transversal slot extending between the two parallel longitudinal slots, and wherein each of the pair of parallel longitudinal slots has a predetermined length that is sized to provide a substantially constant amount of force to the top surface of the component.

8. The apparatus according to claim 7, wherein the distribution of heat along the first cover member is a function of the length of the transversal slot.

9. The apparatus according to claim 6, further comprising a second cover member disposed between the housing and the first cover member, the second cover member defining an opening therein sized for receiving the conductive post, the second cover member being in cooperation with the housing and the first cover member to substantially reduce electromagnetic interference (EMI) caused by one or more components in the module.

10. The apparatus according to claim 9, wherein the second cover member comprises a material selected from the group consisting of aluminum, copper, and tin-plated copper.

11. The apparatus according to claim 9, further comprising flexible conductive material attached to a surface of the first cover member that faces the second cover member for covering the U-shaped slot, wherein the flexible conductive material cooperates with the first and second cover members to substantially prevent the passage of electromagnetic radiation through the U-shaped slot.

12. A circuit pack including one or more modules for housing circuit components, each of the one or more modules having a bottom surface and two pairs of opposing side surfaces extending upwardly from the bottom surface thereby defining a recessed portion for receiving the circuit components, each of the one or more modules comprising:

a first cover member for attachment to the two pairs of opposing side surfaces to cover the recessed portion, the first cover member including a cantilever member and a conductive member extending downwardly from the cantilever member into the module, the conductive member being in cooperation with a top surface of a component in the module so that heat generated from the component is transferred from the component through the conductive member and distributed along the first cover member, the cantilever member being deflectable by engagement of the conductive member with the top surface of the component so that the conductive member is capable of maintaining contact with and providing a substantially constant amount of force to the top surface of the component without damaging the component.

13. The apparatus according to claim 12, wherein the conductive member is in matched arrangement with the component so that the conductive member maintains contact with and provides a substantially constant amount of force to the top surface of the component.

14. A circuit pack including one or more modules for housing circuit components, each of the one or more modules having a bottom surface and two pairs of opposing side surfaces extending upwardly from the bottom surface thereby defining a recessed portion for receiving the circuit components, each of the one or more modules comprising:

a first cover member for attachment to the two pairs of opposing side surfaces to cover the recessed portion, the first cover member including a cantilever member defined by a U-shaped slot in the first cover member, the U-shaped slot having a deflectable end portion, the first cover member further including a conductive member disposed on the deflectable end portion and extending downwardly from the cantilever member into the module, the conductive member being in cooperation with a top surface of a component in the module so that heat generated from the component is transferred from the component through the conductive member and distributed along the first cover member, wherein the cantilever member is deflectable and wherein the conductive member is in matched arrangement with the component so that the conductive member maintains contact with and provides a substantially constant amount of force to the top surface of the component.

15. The apparatus according to claim 12, further comprising a second cover member disposed between the two pairs of opposing side surfaces and the first cover member, the second cover member defining an opening therein sized for receiving the conductive member, the second cover member being in cooperation with the module and the first cover member to substantially reduce electromagnetic interference (EMI) caused by one or more components in the module.

16. An apparatus for dissipating heat and reducing electromagnetic interference from one or more components disposed in a circuit module, the module including a housing having an opening therein for receiving the one or more components, the apparatus comprising:

a first cover member disposed over the opening of the housing, the first cover member including a cantilever beam and a conductive post extending downwardly from the cantilever beam into the module, the conductive post being in cooperation with a top surface of a component in the module so that heat generated from the component is transferred from the component and distributed along the first cover member; and a second cover member disposed between the housing and the first cover member, the second cover member defining an opening therein sized for receiving the conductive post, the second cover member being in cooperation with the housing and the first cover member to substantially reduce electromagnetic interference (EMI) caused by one or more components in the module, the cantilever beam being deflectable by engagement of the conductive post with the top surface of the component so that the conductive post is capable of maintaining contact with and providing a substantially constant amount of force to the top surface of the component without damaging the component.

17. The apparatus according to claim 16, wherein the conductive post is in matched arrangement with the component so that the conductive post maintains contact with and provides a substantially constant amount of force to the top surface of the component.

18. An apparatus for dissipating heat and reducing electromagnetic interference from one or more components disposed in a circuit module, the module including a housing having an opening therein for receiving the one or more components, the apparatus comprising:

a first cover member disposed over the opening of the housing, the first cover member including a cantilever beam defined by a U-shaped slot in the first cover member, the U-shaped slot having a deflectable end portion, the first cover member further including a conductive post disposed on the deflectable end portion and extending downwardly from the cantilever beam into the module, the conductive post being in cooperation with a top surface of a component in the module so that heat generated from the component is transferred from the component and distributed along the first cover member; and a second cover member disposed between the housing and the first cover member, the second cover member defining an opening therein sized for receiving the conductive post, the second cover member being in cooperation with the housing and the first cover member to substantially reduce electromagnetic interference (EMI) caused by one or more components in the module, wherein the cantilever beam is deflectable and wherein the conductive post is in matched arrangement with the component so that the conductive post maintains contact with and provides a substantially constant amount of force to the top surface of the component.

19. A circuit module including one or more components disposed in a housing, the housing having a recessed portion therein for receiving the one or more components, the circuit module comprising:

a first cover member disposed over the recessed portion of the housing, the first cover member including a cantilever beam and a conductive post extending downwardly from the cantilever beam into the module, the conductive post being in cooperation with a top surface of a component in the module so that heat generated from the component is transferred from the component and distributed along the first cover member; and a second cover member disposed between the first cover member and the recessed portion of the housing, the second cover member defining an opening therein sized for receiving the conductive post, the second cover member being in cooperation with the housing and the first cover member to substantially reduce electromagnetic interference (EMI) caused by one or more components in the module, the cantilever beam being deflectable by engagement of the conductive post with the top surface of the component so that the conductive post is capable of maintaining contact with and providing a substantially constant amount of force to the top surface of the component without damaging the component.

20. A circuit module including one or more components disposed in a housing, the housing having a recessed portion therein for receiving the one or more components, the circuit module comprising:

a first cover member disposed over the recessed portion of the housing, the first cover member including a cantilever beam and a conductive post extending downwardly from the cantilever beam into the module, the conductive post being in cooperation with a top surface of a component in the module so that heat generated from the component is transferred from the component and distributed along the first cover member; and a second cover member disposed between the first cover member and the recessed portion of the housing, the second cover member defining an opening therein sized for receiving the conductive post, the second cover member being in cooperation with the housing and the first cover member to substantially reduce electromagnetic interference (EMI) caused by one or more components in the module, wherein the cantilever beam is defined by a U-shaped slot in the first cover member, wherein the U-shaped slot is defined by a pair of parallel longitudinal slots and a transversal slot extending between the pair of parallel longitudinal slots, the conductive post being attached to the cantilever beam in proximity to the transversal slot, and wherein the cantilever beam is deflectable so that the conductive post maintains contact with and provides a substantially constant amount of force to the top surface of the component.

* * * * *